(12) United States Patent
Kim

(10) Patent No.: US 7,233,193 B2
(45) Date of Patent: Jun. 19, 2007

(54) HIGH VOLTAGE SWITCHING CIRCUIT OF A NAND TYPE FLASH MEMORY DEVICE

(75) Inventor: Young Joo Kim, Icheon-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 66 days.

(21) Appl. No.: 11/125,102

(22) Filed: May 10, 2005

(65) Prior Publication Data

US 2006/0044042 A1   Mar. 2, 2006

(30) Foreign Application Priority Data

Aug. 26, 2004   (KR) .................. 10-2004-0067537

(51) Int. Cl.
*H03K 3/01* (2006.01)
(52) U.S. Cl. .................. 327/534; 327/535; 327/537; 327/545; 327/546
(58) Field of Classification Search ............... 327/365, 327/376, 377, 419, 493, 534, 535, 537, 545, 327/546
See application file for complete search history.

(56) References Cited

U.S. PATENT DOCUMENTS

| | | | | |
|---|---|---|---|---|
| 6,157,242 A * | 12/2000 | Fukui | .................. | 327/536 |
| 6,160,723 A * | 12/2000 | Liu | .................. | 363/60 |
| 6,359,814 B1 * | 3/2002 | Sundaram et al. | ..... | 365/189.09 |
| 6,473,321 B2 * | 10/2002 | Kishimoto et al. | .......... | 363/59 |
| 6,480,057 B2 * | 11/2002 | Ogura | .................. | 327/536 |
| 6,781,440 B2 * | 8/2004 | Huang | .................. | 327/537 |
| 7,005,912 B2 * | 2/2006 | Nonaka | .................. | 327/536 |
| 2002/0001207 A1 * | 1/2002 | Kishimoto et al. | .......... | 363/59 |
| 2003/0020526 A1 * | 1/2003 | Ingino, Jr. | .................. | 327/157 |
| 2005/0285577 A1 * | 12/2005 | Tanimoto | .................. | 323/273 |

* cited by examiner

Primary Examiner—Tuan T. Lam
Assistant Examiner—Hiep Nguyen
(74) Attorney, Agent, or Firm—Lowe Hauptman & Berner LLP

(57) ABSTRACT

A high voltage switching circuit of a NAND type flash memory device that includes a clock level shifter for increasing an amplitude of a clock signal, a pass voltage generator for outputting a pass voltage by pumping a power source voltage in response to a clock signal with an increased amplitude, and a high voltage pass transistor for transferring a high voltage according to the pass voltage.

21 Claims, 2 Drawing Sheets

HIGH VOLTAGE SWITCHING CIRCUIT OF A NAND TYPE FLASH MEMORY DEVICE

BACKGROUND

1. Field of the Invention

The present invention relates to a high voltage switching circuit of a NAND type flash memory device and more specifically, to a high voltage switching circuit of a NAND type flash memory device to transfer a high voltage without a voltage drop.

2. Discussion of Related Art

A general high voltage switching circuit is configured as shown in FIG. 1 which is a circuit diagram illustrating the configuration of a high voltage switch circuit in a NAND type flash memory device by a conventional art.

Referring to FIG. 1, a high voltage pass transistor T101 transfers an input high voltage HVIN as being a high voltage HVOUT directly without a voltage drop. For the purpose of that, a pass voltage Vsel is applied to a gate of the high voltage pass transistor T101 so as to stably transfer the high voltage HVIN through the high voltage transistor T101.

A pass voltage generator 100 includes an input circuit 110 transferring a predetermined precharge voltage in response to an internal switching enable signal ENi, and a voltage boosting circuit 120 generating the pass voltage Vsel through a feedback loop using the precharge voltage, a clock signal CLK, and an external high voltage Vpp.

The input circuit 110 includes first and second inverters I101 and I102 buffering the internal switching enable signal ENi, and a first NMOS transistor N101 transferring an output of the second inverter I102.

The voltage boosting circuit 120 includes a pass node Q1 initiated by the precharge voltage and from which the pass voltage Vsel is generated, a diode D1 preventing an excessive boosting result for the pass voltage Vsel, a second NMOS transistor N102 transferring the external high voltage Vpp according to a voltage of the pass node Q1, a third NMOS transistor N103 transferring the voltage of the pass node Q1, which is transferred through the diode D1, according to a potential of the pass node Q1, and first and second capacitors C1 and C2 respectively boosting the voltage of the pass node Q1 and an output voltage of the second NMOS transistor N102 in response to the clock signal CLK. The voltage boosting circuit 120 may further include a third inverter I103 connected between an input terminal of the clock signal CLK and the first capacitor C1, and a fourth inverter I104 connected between an output terminal of the third inverter I103 and the second capacitor C2.

The pass voltage generator 100 outputs the pass voltage Vsel that is pumped up higher than the external high voltage Vpp by the operation with the first and second capacitors C1 and C2, in response to an inversed clock signal /CLK by the third inverter I103 and the non-inversed clock signal CLK by the fourth inverter I104, when the internal switching enable signal ENi is applied thereto.

Here, a potential of the pass node Q1, which has been raised higher through the pumping operation by the first capacitor C1, is further raised through the pumping operation by the second capacitor C2. Through the repetition of the pumping operations, the pass voltage Vsel of the pass node Q1 rises up to a target voltage.

Such a high voltage switching circuit of the NAND type flash memory device becomes difficult in assuring an efficient margin for a power source voltage gradually in accordance with a decrease of the power source voltage for operation. And, the high voltage switching circuit utilizes internal pumping capacitors by itself and obtains a gain by the number of stages of the pumping capacitors, transferring an input voltage as an output voltage without a voltage drop.

However, as the pumping capacitor of the high voltage switching circuit occupies very large circuit area therein, there is a limit to extending the number of the pumping stages regardless of a chip size. Therefore, there exists a need for another way to enhance the efficiency of the high voltage switching circuit without substantially affecting a chip size.

SUMMARY OF THE INVENTION

Accordingly, a high voltage switching circuit of a NAND type flash memory device, proposed by the present invention, employs a boosted clock signal that is used for generating a pass voltage to be applied to a gate of a high voltage transistor, which improves the efficiency of the high voltage switch circuit because it is possible to generate a high pass voltage without substantially affecting a chip size.

A high voltage switching circuit of a NAND type flash memory device according to an embodiment of the present invention comprises a clock level shifter for increasing an amplitude of a clock signal, a pass voltage generator outputting a pass voltage by pumping a power source voltage in response to an amplitude enlarged clock signal, and a high voltage pass transistor transferring a high voltage according to the pass voltage.

In embodiments the clock level shifter may include: precharging means connected to a power source voltage terminal and configured to precharge first and second nodes; a first capacitor connected between the first node and an input terminal of the clock signal, increasing a voltage of the first node in response to the clock signal; a second capacitor connected between the second node and an input terminal of an inversed clock signal, increasing a voltage of the second node in response to the inversed clock signal; a first switching element connected between the first node and a first output terminal, transferring an increased voltage of the first node to the first output terminal; a second switching element connected between the second node and a second output terminal, transferring an increased voltage of the second node to the second output terminal; a first discharging element discharging the first output terminal in response to the inversed clock signal; and a second discharging element discharging the second output terminal in response to the clock signal.

The precharging means may include first means for precharging the first node, and second means for precharging the second node.

In embodiments, the first means may include: a transistor connected between the power source voltage terminal and the first node, being operable in accordance with a potential of the second node; and a diode connected between the power source voltage terminal and the first node. The second means may include: a transistor connected between the power source voltage terminal and the second node, being operable in accordance with a potential of the first node; and a diode connected between the power source voltage terminal and the second node. The transistor may be formed of an NMOS transistor and the diode may be formed of an NMOS transistor whose gate is connected to the power source voltage terminal.

In another embodiment, the high voltage switching circuit may further comprise: a first delay circuit connected between the clock signal input terminal and the first capacitor, for delaying the clock signal; and a second delay circuit connected between the clock signal input terminal and the second capacitor, for delaying the inversed clock signal.

In embodiments, the first or second switching element may be formed of a PMOS transistor whose gate is coupled to the power source voltage, and the first or second discharging element may be formed of an NMOS transistor.

In embodiments, the pass voltage generator includes: an input circuit transferring a precharge voltage to a pass node, which is connected to a gate of the high voltage pass transistor, in response to an internal switching enable signal; a first capacitor connected to the pass node, conducting a pumping operation in response to the amplitude enlarged clock signal; a diode connected between the pass node and the power source voltage terminal, preventing an excessive boosting for the pass voltage; a first NMOS transistor connected to the power source voltage terminal, transferring a voltage of the pass node that is transferred through the diode in accordance with a potential of the pass node; a second NMOS transistor with a gate connected to the first NMOS transistor, being connected between the pass node and the first NMOS transistor; and a second capacitor connected to a gate of the second NMOS transistor, conducting a pumping operation in response to an inversed one of the amplitude enlarged clock signal.

BRIEF DESCRIPTION OF THE DRAWINGS

The accompanying drawings are included to provide a further understanding of the invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
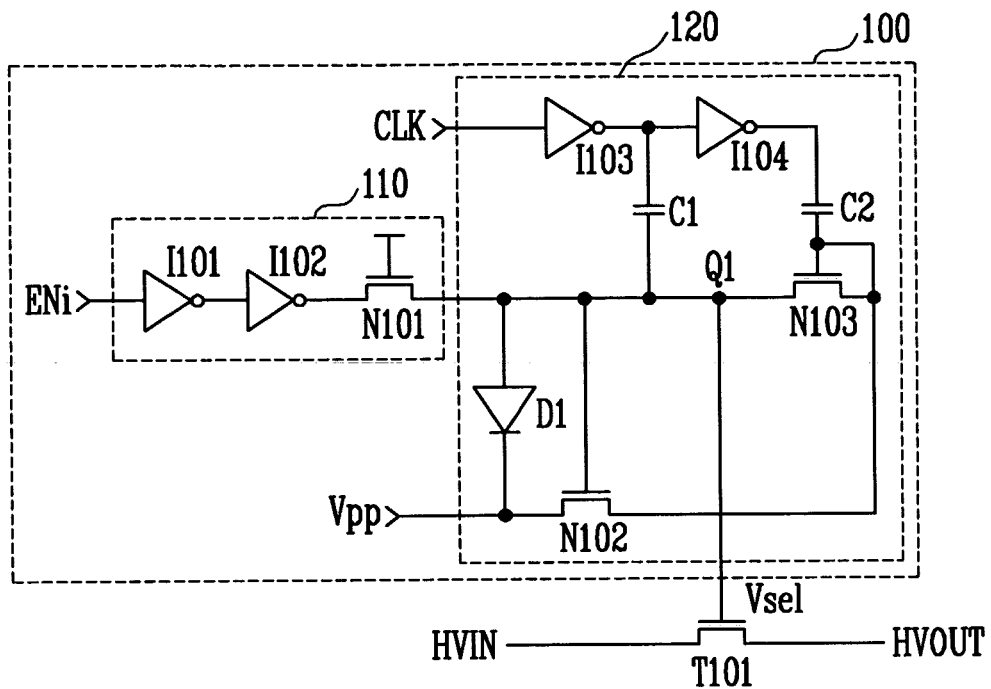
FIG. 1 is a circuit diagram illustrating the configuration of a high voltage switch circuit in a NAND flash memory device by a conventional art.

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, like numerals refer to like elements throughout the specification.

Figure 2:
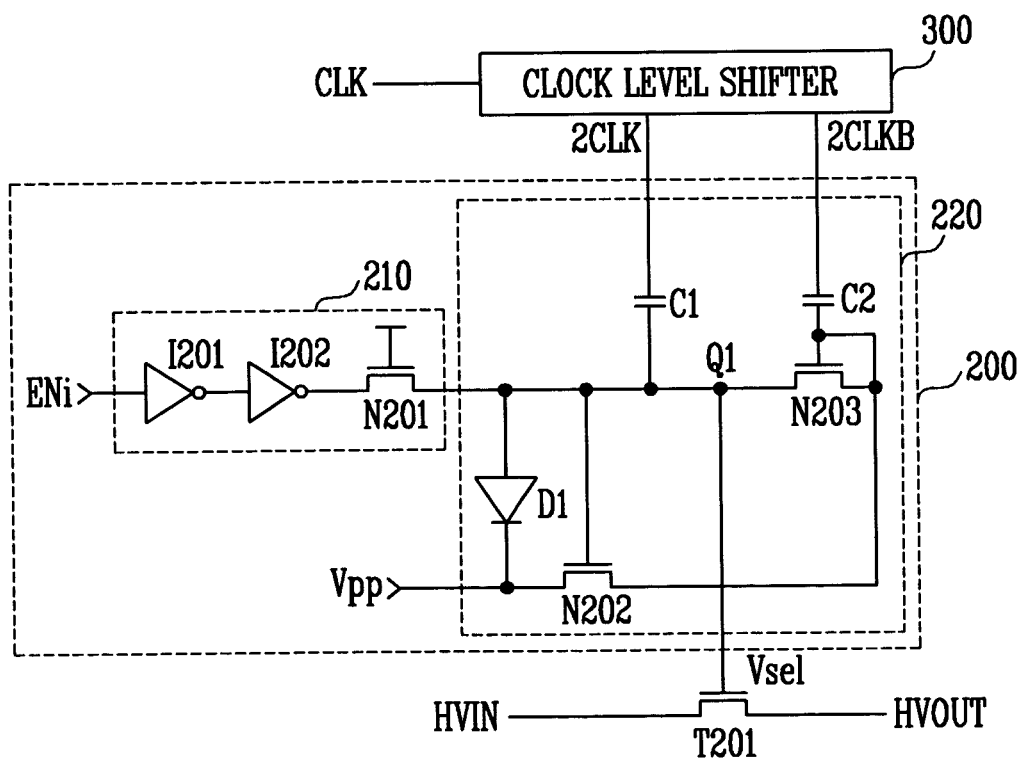
FIG. 2 is a circuit diagram illustrating a high voltage switch circuit in a NAND flash memory device in accordance with an embodiment of the present invention.

FIG. 2 is a circuit diagram illustrating a high voltage switch circuit in a NAND flash memory device in accordance with an embodiment of the present invention.

Referring to FIG. 2, the high voltage switching circuit of the NAND flash memory device, according to the present invention, is comprised of a clock level shifter 300, a pass voltage generator 200, and a high voltage transistor T201.

The clock level shifter 300 doubles the amplitude of a clock signal CLK to 2CLK. Then, the clock signal 2CLK with twice the amplitude and an inversed clock signal 2CLKB are applied to the pass voltage generator 200 to output a pass voltage Vsel. In other words, the clock signal 2CLK and the inversed clock signal 2CLKB are applied to two capacitors C1 and C2, respectively, included in the pass voltage generator 200.

The pass voltage generator 200 increases a voltage of a pass node Q1 in response to the clock signal 2CLK and the inversed clock signal 2CLKB, which are applied each to the capacitors C1 and C2, and thereby generates a pass voltage Vsel. During this, as the pumping operation is carried out by the capacitors C1 and C2 responding to the clock signals 2CLK and 2CLKB each of which has twice the amplitude of the clock signal CLK, the pass voltage Vsel can be generated with a high enough potential (or voltage). The pass voltage generator 200 is similar to that shown in FIG. 1, but the clock signals 2CLK and 2CLKB are applied thereto instead of the clock signal CLK. Thus, the structure and operation of the pass voltage generator will not be further described in detail.

The pass voltage Vsel supplied with a high enough potential by the pass voltage generator 200 is applied to a gate of a high voltage transistor T201, by which the high voltage transistor T201 transfers an input high voltage HVIN as an output high voltage HVOUT without a voltage drop.

Now, the structure and operation of the clock level shifter 300 that doubles the amplitude of the clock signal CLK, among the structural components of the high voltage switching circuit will be described.

Figure 3:
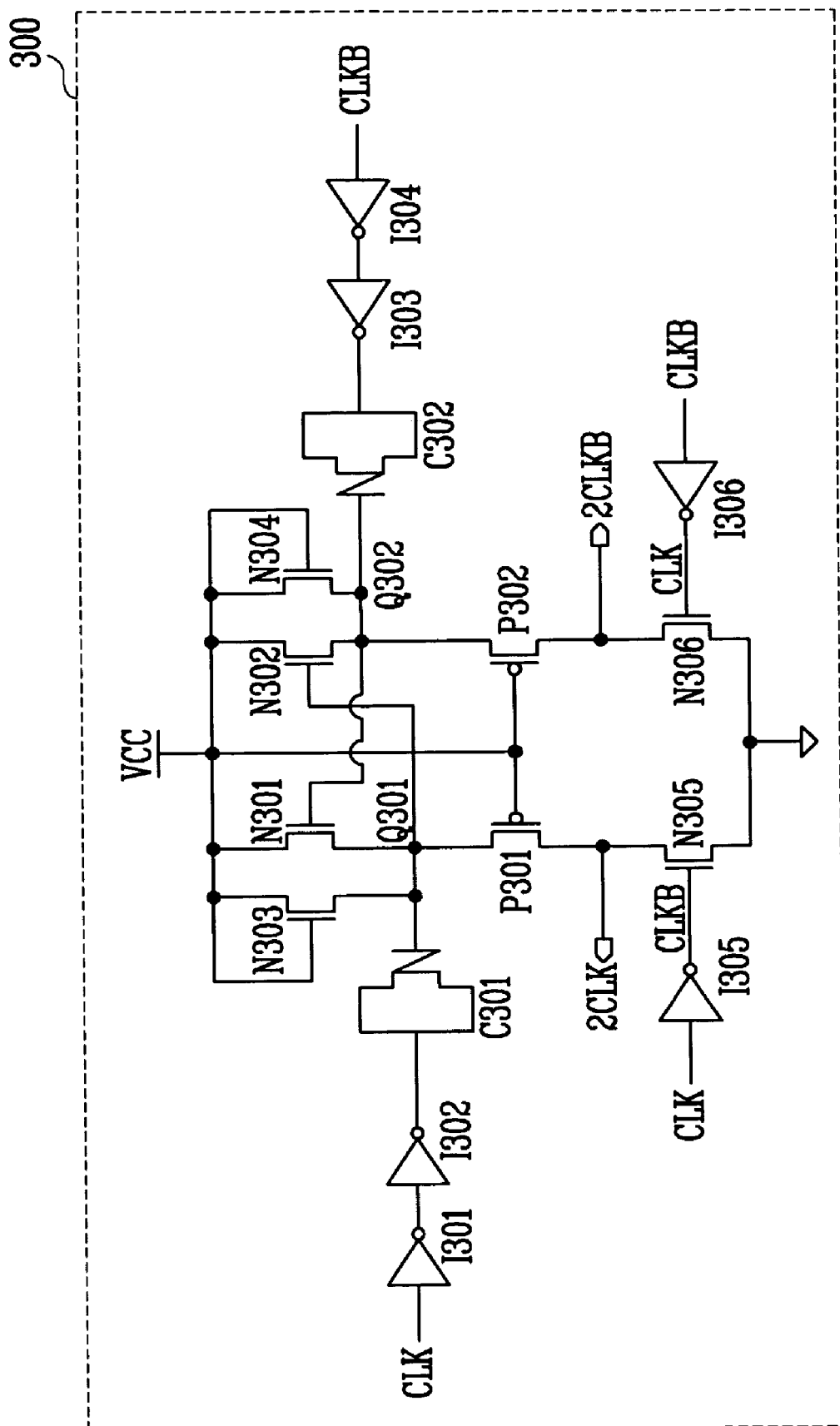
FIG. 3 is a circuit diagram illustrating a clock level shifter shown in FIG. 2 in accordance with an embodiment of the present invention.

FIG. 3 is a circuit diagram illustrating the clock level shifter shown in FIG. 2 in accordance with an embodiment of the present invention.

Referring to FIG. 3, a first transistor N301 is connected between a power source voltage terminal Vcc and a first node Q301, and a second transistor N302 is connected between the power source voltage terminal Vcc and a second node Q302. Here, the first transistor N302 is operable in accordance with a potential of the second node Q302, while the second transistor N302 is operable in accordance with a potential of the first node Q301. A first diode N303 is connected between the power source voltage terminal Vcc and the first node Q301, and a second diode N304 is connected between the power source voltage terminal Vcc and the second node Q302.

In the above exemplary configuration, the first transistor N301 and the first diode N303 act as means to precharge the first node Q301 before beginning the pumping operation. And, the second transistor N302 and the second diode N304 act as means to precharge the second node Q302 before beginning the pumping operation.

A first capacitor C301 is connected between an input terminal of the clock signal CLK and the first node Q301. A voltage of the first node Q301 begins to be pumped up when the clock signal CLK is active with high level after the first node Q301 has been precharged. On the other side, a second capacitor C302 is connected between an input terminal of the inversed clock signal CLKB and the second node Q302. A voltage of the second node Q302 begins to be pumped up when the inversed clock signal CLKB is active with high level after the second node Q302 has been precharged.

A fifth transistor P301 with a gate to which the power source voltage Vcc is applied is connected between the first node Q301 and a first output terminal from which the pumped clock signal 2CLK is generated, for transferring a voltage of the first node Q301, which is raised by the pumping operation, to the first output terminal. In other words, the fifth transistor P301 transfers the voltage of the first node Q301 to the first output terminal only when the voltage of the first node Q301 reaches a desired high level by the pumping operation. By way of the operation, the clock signal CLK is output as the clock signal 2CLK having an increased amplitude.

A sixth transistor P302 with a gate to which the power source voltage Vcc is applied is connected between the second node Q302 and a second output terminal from which the pumped and inversed clock signal 2CLKB is generated, for transferring a voltage of the second node Q302, which is raised by the pumping operation, to the second output terminal. In other words, the sixth transistor P302 transfers the voltage of the second node Q302 to the second output terminal only when the voltage of the second node Q302 reaches a desired high level by the pumping operation. By way of the operation, the inversed clock signal CLKB is output as the inversed clock signal 2CLKB having an increased amplitude.

A seventh transistor N305 is connected the first output terminal and a ground terminal, for discharging the first output terminal when the inversed clock signal 2CLKB is active according to the inversed clock signal CLKB. In other words, the seventh transistor N305 acts as a means to discharge the first output terminal.

An eighth transistor N306 is connected to the second output terminal and the ground terminal, for discharging the second output terminal when the clock signal 2CLK is active according to the clock signal CLK. In other words, the eighth transistor N306 acts as a means to discharge the second output terminal.

Meanwhile, the clock signal CLK may be applied thereto with delay so as to pump the voltage of the first node Q301 in response to the clock signal CLK at the precharged state of the first node Q301. For this operation, there is provided a first delay circuit composed of the first and second inverters I301 and I302, through which the clock signal CLK is applied to the first capacitor C301. Similarly, there is provided a second delay circuit composed of the third and fourth inverters I303 and I304, through which the inversed clock signal CLKB is applied to the second capacitor C302.

With the clock level shifter constructed with the aforementioned features, the amplitude of the clock signal CLK and the inversed clock signal CLKB are increased and the increased amplitude clock signals 2CLK and 2CLKB are used in generating the pass voltage Vsel with a higher level, thereby enabling the high voltage pass transistor T101 to transfer the input high voltage HVIN without a voltage drop.

Further, in the above configuration of the clock level shifter, as the capacitors C301 and C302 are implemented by transistors, it does not substantially affect a chip size.

Accordingly, the high voltage switching circuit of the present invention uses a boosted clock signal that is used for generating a pass voltage to be applied to a gate of a high voltage transistor, which improves the efficiency of the high voltage switch circuit because it is possible to generate a high pass voltage without substantially affecting a chip size.

Although the present invention has been described in connection with the above embodiment of the present invention illustrated in the accompanying drawings, it is not limited thereto. It will be apparent to those skilled in the art that various substitution, modifications and changes may be made without departing from the scope and spirit of the invention.

What is claimed is:

1. A high voltage switching circuit of a NAND type flash memory device, the high voltage switching circuit comprising:
a clock level shifter for increasing an amplitude of a clock signal, wherein the clock level shifter comprises:
precharging means connected to a power source voltage terminal and configured to precharge first and second nodes;
a first capacitor connected between the first node and an input terminal of the clock signal, for increasing a voltage of the first node in response to the clock signal;
a second capacitor connected between the second node and an input terminal of an inversed clock signal, for increasing a voltage of the second node in response to the inversed clock signal;
a first switching element connected between the first node and a first output terminal, for transferring an increased voltage of the first node to the first output terminal;
a second switching element connected between the second node and a second output terminal, for transferring an increased voltage of the second node to the second output terminal;
a first discharging element for discharging the first output terminal in response to the inversed clock signal; and
a second discharging element for discharging the second output terminal in response to the clock signal;
a pass voltage generator for outputting a pass voltage by pumping an external high voltage(Vpp) in response to a clock signal with an increased amplitude; and
a high voltage pass transistor for transferring an input high voltage(HVIN) according to the pass voltage.

2. The high voltage switching circuit as set forth in claim 1, wherein the precharging means comprises:
first means for precharging the first node; and
second means for precharging the second node.

3. The high voltage switching circuit as set forth in claim 2, wherein the first means for precharging the first node comprises:
a transistor connected between the power source voltage terminal and the first node, the transistor being operable in accordance with a potential of the second node; and
a diode connected between the power source voltage terminal and the first node.

4. The high voltage switching circuit as set forth in claim 2, wherein the second means for precharging the second diode comprises:
a transistor connected between the power source voltage terminal and the second node, the transistor being operable in accordance with a potential of the first node; and
a diode connected between the power source voltage terminal and the second node.

5. The high voltage switching circuit as set forth in claim 3, wherein the transistor is formed of an NMOS transistor.

6. The high voltage switching circuit as set forth in claim 3, wherein the diode is formed of an NMOS transistor whose gate is connected to the power source voltage terminal.

7. The high voltage switching circuit as set forth in claim 1, further comprising:
a first delay circuit connected between the clock signal input terminal and the first capacitor, for delaying the clock signal; and
a second delay circuit connected between the clock signal input terminal and the second capacitor, for delaying the inversed clock signal.

8. The high voltage switching circuit as set forth in claim 1, wherein the first or second switching element is formed of a PMOS transistor whose gate is coupled to the power source voltage.

9. The high voltage switching circuit as set forth in claim 1, wherein the first or second discharging element is formed of an NMOS transistor.

10. The high voltage switching circuit as set forth in claim 1, wherein the pass voltage generator comprises:
an input circuit for buffering an internal switching enable signal(ENi) and transferring the buffered signal to a pass node, which is connected to a gate of the high voltage pass transistor;
a first capacitor connected to the pass node, for conducting a pumping operation in response to the clock signal with an increased amplitude;
a diode connected between the pass node and an external high voltage(Vpp) terminal, for preventing the pass node from excessively boosting;
a first NMOS transistor connected to the external high voltage(Vpp) terminal, for transferring a voltage of the pass node that is transferred through the diode in accordance with a potential of the pass node;
a second NMOS transistor with a gate connected to the first NMOS transistor, the second NMOS transistor being connected between the pass node and the first NMOS transistor; and
a second capacitor connected to a gate of the second NMOS transistor, for conducting a pumping operation in response to an inversed one of the clock signal with an increased amplitude.

11. A high voltage switching circuit comprising:
a clock level shifter for increasing amplitude of a clock signal, wherein the clock level shifter comprises:
precharging means connected to a power source voltage terminal and configured to precharge first and second nodes;
a first capacitor connected between the first node and an input terminal of the clock signal, for increasing a voltage of the first node in response to the clock signal;
a second capacitor connected between the second node and an input terminal of an inversed clock signal, for increasing a voltage of the second node in response to the inversed clock signal;
a first switching element connected between the first node and a first output terminal, for transferring an increased voltage of the first node to the first output terminal;
a second switching element connected between the second node and a second output terminal, for transferring an increased voltage of the second node to the second output terminal;
a first discharging element for discharging the first output terminal in response to the inversed clock signal; and
a second discharging element for discharging the second output terminal in response to the clock signal.

12. The high voltage switching circuit as set forth in claim 11, wherein the precharging means comprises:
first means precharging the first node; and
second means precharging the second node.

13. The high voltage switching circuit as set forth in claim 12, wherein the first means comprises:
a transistor connected between the power source voltage terminal and the first node, being operable in accordance with a potential of the second node; and
a diode connected between the power source voltage terminal and the first node.

14. The high voltage switching circuit as set forth in claim 12, wherein the second means comprises:
a transistor connected between the power source voltage terminal and the second node, being operable in accordance with a potential of the first node; and
a diode connected between the power source voltage terminal and the second node.

15. The high voltage switching circuit as set forth in one of claim 13, wherein the transistor is formed of an NMOS transistor.

16. The high voltage switching circuit as set forth in one of claim 13, wherein the diode is formed of an NMOS transistor whose gate is connected to the power source voltage terminal.

17. The high voltage switching circuit as set forth in claim 11, which further comprises:
a first delay circuit connected between the input terminal of the clock signal and the first capacitor, delaying the clock signal; and
a second delay circuit connected between the input terminal of the clock signal and the second capacitor, delaying the inversed clock signal.

18. The high voltage switching circuit as set forth in claim 11, wherein the first or second switching element is formed of a PMOS transistor whose gate is coupled to the power source voltage.

19. The high voltage switching circuit as set forth in claim 11, wherein the first or second discharging element is formed of an NMOS transistor.

20. The high voltage switching circuit as set forth in claim 11, further comprising:
a pass voltage generator for outputting a pass voltage by pumping an external high voltage(Vpp) in response to the clock signal of which amplitude is increased by the clock level shifter; and a high voltage pass transistor for transferring an input high voltage(HVIN) according to the pass voltage.

21. The high voltage switching circuit as set forth in claim 20, wherein the pass voltage generator comprises:
an input circuit for buffering an internal switching enable signal(ENi) and transferring the buffered signal to a pass node, which is connected to a gate of the high voltage pass transistor;
a first capacitor connected to the pass node, conducting a pumping operation in response to the amplitude enlarged clock signal;
a diode connected between the pass node and an external high voltage(Vpp) terminal, preventing the pass node from excessively boosting;
a first NMOS transistor connected to the external high voltage(Vpp) terminal, transferring a voltage of the pass node that is transferred through the diode in accordance with a potential of the pass node;
a second NMOS transistor with a gate connected to the first NMOS transistor, being connected between the pass node and the first NMOS transistor; and
a second capacitor connected to a gate of the second NMOS transistor, conducting a pumping operation in response to an inversed one of the amplitude enlarged clock signal.

* * * * *